United States Patent
Thibedeau et al.

(10) Patent No.: US 6,777,941 B2
(45) Date of Patent: Aug. 17, 2004

(54) ALTERNATOR TESTING METHOD AND SYSTEM USING TIMED APPLICATION OF LOAD

(75) Inventors: Dennis G. Thibedeau, Franklin, WI (US); Richard J. Faehnrich, Arlington Heights, IL (US); Alejandro P. Brott, Chicago, IL (US); Alan D. Goctzelmann, Wheeling, IL (US); Paul A. Willems, Kenosha, WI (US)

(73) Assignee: Snap-On Incorporated, Pleasant Prairie, WI (US)

( * ) Notice: Subject to any disclaimer, the term of this patent is extended or adjusted under 35 U.S.C. 154(b) by 22 days.

(21) Appl. No.: 09/888,382

(22) Filed: Jun. 26, 2001

(65) Prior Publication Data

US 2002/0011829 A1 Jan. 31, 2002

Related U.S. Application Data

(60) Provisional application No. 60/214,254, filed on Jun. 26, 2000.

(51) Int. Cl.$^7$ .............................................. F02P 17/00
(52) U.S. Cl. ....................................................... 324/378
(58) Field of Search ................................ 324/378, 380, 324/382, 384, 76.41, 429, 618, 433, 434, 772, 166, 177, 160; 322/28–32, 8, 99; 320/132, 134; 307/154, 10.6; 123/179.1, 334

(56) References Cited

U.S. PATENT DOCUMENTS

| | | | |
|---|---|---|---|
| 3,848,181 A | 11/1974 | Hebert, Jr. et al. | 324/29.5 |
| 3,907,398 A | 9/1975 | Hebert, Jr. et al. | 339/112 L |
| 4,028,616 A * | 6/1977 | Stevens | 324/433 |
| 4,314,193 A | 2/1982 | Mortonson | 322/28 |
| 4,315,204 A | 2/1982 | Sievers et al. | 322/28 |
| 4,352,067 A | 9/1982 | Ottone | 324/434 |
| 4,377,786 A | 3/1983 | Paul et al. | 324/426 |
| 4,379,990 A | 4/1983 | Sievers et al. | |
| 4,895,308 A * | 1/1990 | Tanaka | 241/65 |
| 5,121,066 A | 6/1992 | Owski et al. | 324/618 |
| 5,151,647 A | 9/1992 | Frantz | 322/99 |
| 5,233,285 A | 8/1993 | Pierret et al. | 320/28 |
| 5,254,952 A * | 10/1993 | Salley et al. | 324/429 |
| 5,257,463 A | 11/1993 | Wheeler et al. | 34/20 |
| 5,424,588 A | 6/1995 | Cantor et al. | 307/154 |
| 5,426,371 A | 6/1995 | Salley et al. | 324/429 |
| 5,677,839 A | 10/1997 | Kondo | 364/424.034 |
| 5,700,089 A | 12/1997 | McKinnon | 374/142 |
| 5,701,089 A | 12/1997 | Perkins | 324/772 |
| 5,773,977 A | 6/1998 | Dougherty | 324/429 |
| 5,789,935 A * | 8/1998 | Suga et al. | 324/772 |
| 5,811,976 A | 9/1998 | Fischer | 324/434 |
| 5,899,947 A | 5/1999 | Hall et al. | 701/33 |
| 6,064,186 A | 5/2000 | Pierret et al. | 322/28 |
| 6,081,103 A | 6/2000 | Pierret | 322/36 |
| 6,144,185 A | 11/2000 | Dougherty et al. | 320/132 |
| 6,166,523 A | 12/2000 | Singh et al. | 320/132 |
| 6,166,548 A | 12/2000 | Winzer et al. | 324/433 |
| 6,172,483 B1 | 1/2001 | Champlin | 320/134 |
| 6,331,762 B1 * | 12/2001 | Bertness | 320/134 |

FOREIGN PATENT DOCUMENTS

| | | |
|---|---|---|
| DE | 40 12248 A1 | 10/1991 |
| EP | 0591871 A | 4/1994 |
| EP | 0 733 791 A | 9/1996 |
| EP | 0865143 A | 9/1998 |
| FR | 2 574 187 | 6/1986 |
| GB | 2 073 464 A | 10/1981 |
| GB | 2 058 367 A | 4/1991 |

* cited by examiner

Primary Examiner—N. Le
Assistant Examiner—Amy He
(74) Attorney, Agent, or Firm—McDermott Will & Emery LLP

(57) ABSTRACT

An alternator testing method and system that provides high resolution signals and stable loads during alternator tests. The method couples a load to the alternator, and evaluates the operation of the alternator based on parameters collected only after the load has been coupled to the alternator for a first predetermined period of time. The method may further include a step of detecting the speed of the alternator or motor driving the alternator. In one embodiment, the load is applied to the alternator only after motor speed or alternator speed reaches a predetermined level. The load may be automatically decoupled from the alternator after the load has been coupled to the alternator for a second predetermined period of time.

27 Claims, 4 Drawing Sheets

ALTERNATOR TESTING METHOD AND SYSTEM USING TIMED APPLICATION OF LOAD

RELATED APPLICATION

The present application claims the benefit of priority from U.S. Provisional Patent Application Serial No. 60/214,254, entitled "AUTOMATIC ELECTRICAL SYSTEM TESTING APPARATUS AND METHODS," filed Jun. 26, 2000.

FIELD OF THE INVENTION

The present invention relates generally to testing alternators, and more specifically, to an alternator testing method and system controlling the coupling of a load to the alternator during the test.

BACKGROUND OF THE INVENTION

An alternator converts mechanical motions into alternating current (AC) by electromagnetic induction. The alternating current is then passed through a rectifier assembly, such as a full-wave rectifier bridge comprising diodes, to convert the AC into DC to power other electrical systems. For example, an alternator in an automotive vehicle is driven by the engine to power the vehicle's electrical system, such as for charging the battery, powering headlights, and the like. The alternator output, however, is not perfectly smooth. The waveform of an alternator output is similar to a low-magnitude ripple riding on a DC component.

Alternator tests are conducted when alternators are under load, i.e., a load is coupled to the output terminals of the alternator to draw current therefrom. Alternator testers often have a set of probes or wires to couple to the output terminals of the alternator for detecting parameters of the alternator output, such as the output voltage, the ripple amplitude, the average current of the output, and so on. Usually, handheld alternator testers for testing vehicle alternators use a load capable of drawing up to 10 amperes of current. For alternators used in an automotive vehicle, the test of alternator under load may be conducted by turning on electrical accessories powered by the alternator, such as the head lights, radio, air conditioner, and the like.

Several problems may occur when testing alternators. First, since the ripple component of the alternator output is a small signal, the ripple waveform is subject to noise interference and may be difficult to observe. Second, when the load is coupled to the alternator, the alternator output waveform may not respond to, or does not always respond to the change of load immediately. Accordingly, the alternator output is unstable until a certain period of time has elapsed. If the tester determines alternator operation based on parameters collected from the unstable waveform, error in test results will occur. Third, using electrical accessories on a vehicle as a load draws inconsistent currents from the alternator. The alternator output level therefore tends to fluctuate, which makes precise test difficult. In addition, the load used in alternator tests generates a lot of heat, which causes safety concerns.

SUMMARY OF THE INVENTION

Accordingly, there exists a need for accurately determining the health of an alternator. There is another need to provide a stable load for use in alternator tests. Still another exists for evaluating the health of an alternator based on a stable alternator output. An additional need exists for providing high resolution signals for testing an alternator. There is still another need for dissipating heat generated by the load during the alternator test.

These and other needs are addressed by the present invention. The invention is an alternator testing method and system that provides high resolution signals and stable loads during alternator tests. According to one aspect of the invention, evaluation of the alternator operation is based on parameters collected after the load is coupled to the alternator for a predetermined period of time, so that the parameters reflect a stable alternator output. In another aspect, the load is coupled to the alternator for a very short period of time to reduce the heat generated during the test. In still another aspect, the load is housed in a handheld housing and capable of drawing large currents, for example, 50 amperes, from the alternator in order to produce better signal resolution.

The method according to the present invention comprises the steps of: coupling a load to the alternator, evaluating the operation of the alternator based on parameters collected after the load has been coupled to the alternator for a first predetermined period of time.

In one aspect of the invention, the alternator may be driven by a motor, such as an engine powered by fossil fuels. According to one embodiment of the invention, the method further includes a step of detecting motor speed or alternator speed. The load is applied to the alternator only after the motor speed or alternator speed reaches a predetermined level. In another aspect of the invention, the load is decoupled from the alternator after the load has been coupled to the alternator for a predetermined period of time.

The system of the present invention comprises a load, and a terminal for receiving an alternator output signal representative of an alternator characteristic, and a switch device for selectively coupling the load to the alternator. A controller is configured for determining the characteristics of the alternator output signal and for generating a first switch operation signal to control the switch device to couple the load to the alternator. The controller determines the characteristics of the alternator output signal based on parameters collected after the load has been coupled to the alternator for a predetermined period of time.

According to one aspect of the invention, the system is contained in a housing having a size suitable to be held in one's hand. The system may further include a cooling device, such as a fan, for dissipating the heat generated by the load. The controller generates a second switch operation signal to control the switch device to decouple the load from the alternator after the load has been coupled to the alternator for a predetermined period of time.

Still other advantages and novel features of the present invention will be apparent from the following detailed description, simply by way of illustration of the invention and not limitation. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings in which like reference numerals refer to similar elements and in which.

DESCRIPTION OF THE PREFERRED EMBODIMENT

In the following description, for purpose of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Figure 1:
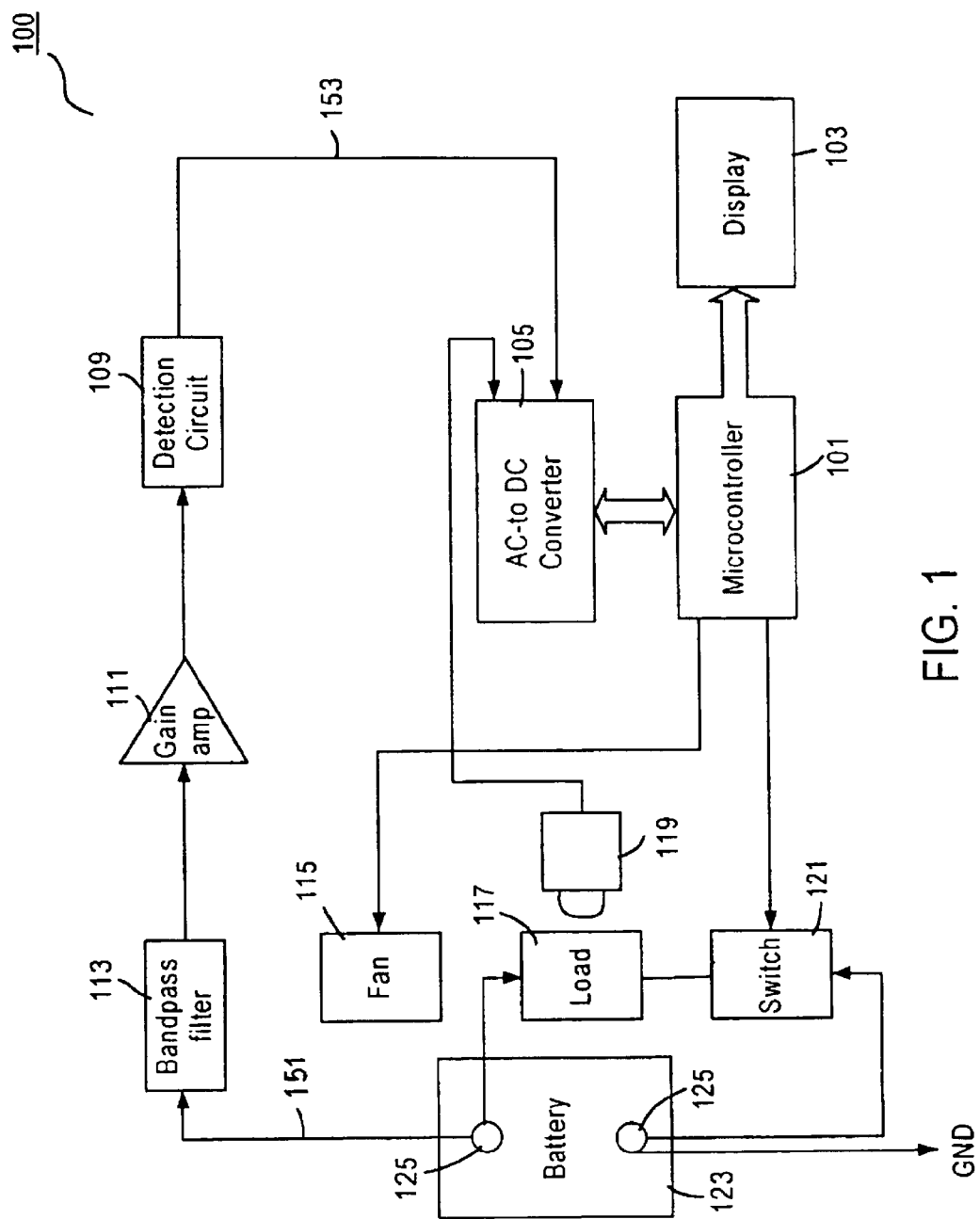
FIG. 1 shows a block diagram of an alternator testing system implemented according to the present invention.

FIG. 1 shows a block diagram of an alternator testing system 100 implemented according to the present invention. For purpose of illustration, the operation of the testing system is described with an alternator in an automotive vehicle. In an automotive vehicle, the alternator (not shown) is driven by the engine of the automotive vehicle to generate electricity. The output of the alternator is coupled to a battery 123 via a set of battery terminals 125 and charges the battery therefrom.

Testing system 100 may be a handheld device and may have terminals for receiving an alternator output signal 215 representative of the alternator output. The alternator output signal may be the electric current generated by the alternator charging battery 123. Alternatively, the alternator output signal may be a signal from a data processing system representative of the alternator output. The data processing system, for example, may be an on-board vehicle computer or other testing equipment. In another aspect, the alternator output signal may be a signal generated by a wireless transmission assembly that transmits signals representative of alternator characteristics wirelessly.

Testing system 100 has a microcontroller 101, an analog-to-digital converter 105 and a display 103. Microcontroller 101 processes data and generates control signals. Analog-to-digital converter 105 converts analog signals to digital signals. Display 103 provides a communication interface with a user and may be an LCD screen, an LED indicator or the like. Microcontroller 101 may control a switch device 121, such as an FET switch, that selectively couples a load 117 to the alternator. As illustrated in FIG. 1, switch device 121 and load 117 are serially connected and then coupled to the alternator in parallel via battery terminals 125. If switch device 121 is on, load 117 is coupled to the alternator; if switch device 121 is off, load 117 is decoupled from the alternator. Other circuit design techniques known to persons skilled in the art can be used for controlling the coupling of the load to the alternator.

Load 117 may be any component that is capable of drawing large currents from the alternator, while maintaining small voltage across it, for example, a Nichrome wire wound into a coil. As an example, load 117 may be a Nichrome coil that draws 50 amperes of current from the alternator. A Nichrome coil load is advantageous due to its ability to handle a substantial amount of current, while maintaining compact sizing. A cooling device 115, such as a cooling fan, controlled by microcontroller 101, may be provided to help dissipate heat generated by load 117.

While the alternator test may be conducted at any alternator speed or engine speed, the engine may be driven to a stable engine speed, such as 1500 rpm or above, to ensure the alternator generates a stable alternator output signal. As an alternative, the test may be conducted at idle engine speed. A user may indicate to the system that the engine speed has reached a certain level by observing readings from a tachometer. Alternatively, experienced users may be able to determine the engine speed based on the audible noise generated by the engine. According to an embodiment, the system may receive a signal representing an engine speed or an alternator speed from other data processing systems, such as a vehicle computer or other testing equipment or the like. The signal representing the engine speed or the alternator speed may be fed to, and processed by, microcontroller 101.

Upon the engine speed or the alternator speed reaching a predetermined level, such as 1500 rpm for the engine speed, microcontroller 101 generates a first switch control signal to turn on switch 121 so that load 117 is coupled to the alternator via battery terminals 125. The alternator is now operating under load.

Alternator output signal 151 may first pass through a bandpass filter 113 in order to eliminate harmonics as well as noise picked up at battery terminals 125. Bandpass filter 113 may have a pass band between 100 Hz and 4 kHz. Alternator output signal 151 may then pass through an amplifier 111 to amplify signal level.

Alternator output signal 151 is then fed to a detection circuit 109. Detection circuit 109 generates a parameter signal 153 representative of parameters of the alternator output signal 151, such as ripple amplitude, voltage level and the like. This current may use conventional filtering and load detection to produce the desired alternator parameters. Copending non-provisional patent application serial number 09/888,385, filed concurrently herewith and titled "Alternator Testing Method and System Using Ripple Detection," by the same inventors and commonly assigned, describes a particular ripple detection circuit and methodology that could be implemented. The disclosure incorporated herein by reference. The parameters are used by microcontroller 101 to determine the characteristics of the alternator. Techniques using parameters of alternator output signals to determine alternator operation are described in U.S. Pat. Nos. 3,629,704, 4,459,548, and 4,315,204, incorporated herein by reference. Parameter signal 153 is next sent to analog-to-digital converter 105 and then into microcontroller 101.

According to one embodiment of the invention, although parameters of alternator output signal 151 may be available upon load 117 coupling to the alternator via battery terminals 125, microcontroller 101 will evaluate the alternator health based on parameters picked up only after load 117 has been coupled to the alternator for a predetermined period of time, such as 0.75 second. The predetermined period of time, chosen to occur when the alternator output signal is stable, may be set empirically based on parameters like alternator model, alternator rating, types of load.

In another aspect of the invention, after load 117 has been coupled to the alternator for a predetermined period of time, for example, one second, microcontroller 101 will issue a second switch control signal to turn off switch device 121, which in turn decouples load 117 from the alternator. Since load 117 is coupled to the alternator for a short period of time, heat generated by the current passing load 117 is minimal. The predetermined period of time is chosen at a point of time before the load becomes too hot due to the current passing through it. The predetermined period of time may be empirically set based on parameters like the threshold temperature, alternator model, alternator rating, types of load.

A cooling device 115, such as a fan, controlled by microcontroller 101, may be implemented to help dissipate the heat generated by load 117. Testing system 100 may have a temperature sensor 119 disposed near load 117 for generating a temperature signal to microcontroller 101 indicating the temperature near or at load 117. Based on the detected temperature, microcontroller 101 controls the operation of cooling device 115: if the temperature is higher than a predetermined temperature, such as 70° C., microcontroller 101 issues a signal to turn on cooling device 115; if the temperature is lower than the predetermined temperature, microcontroller 101 issues a signal to turn off cooling device 115.

Figure 2:
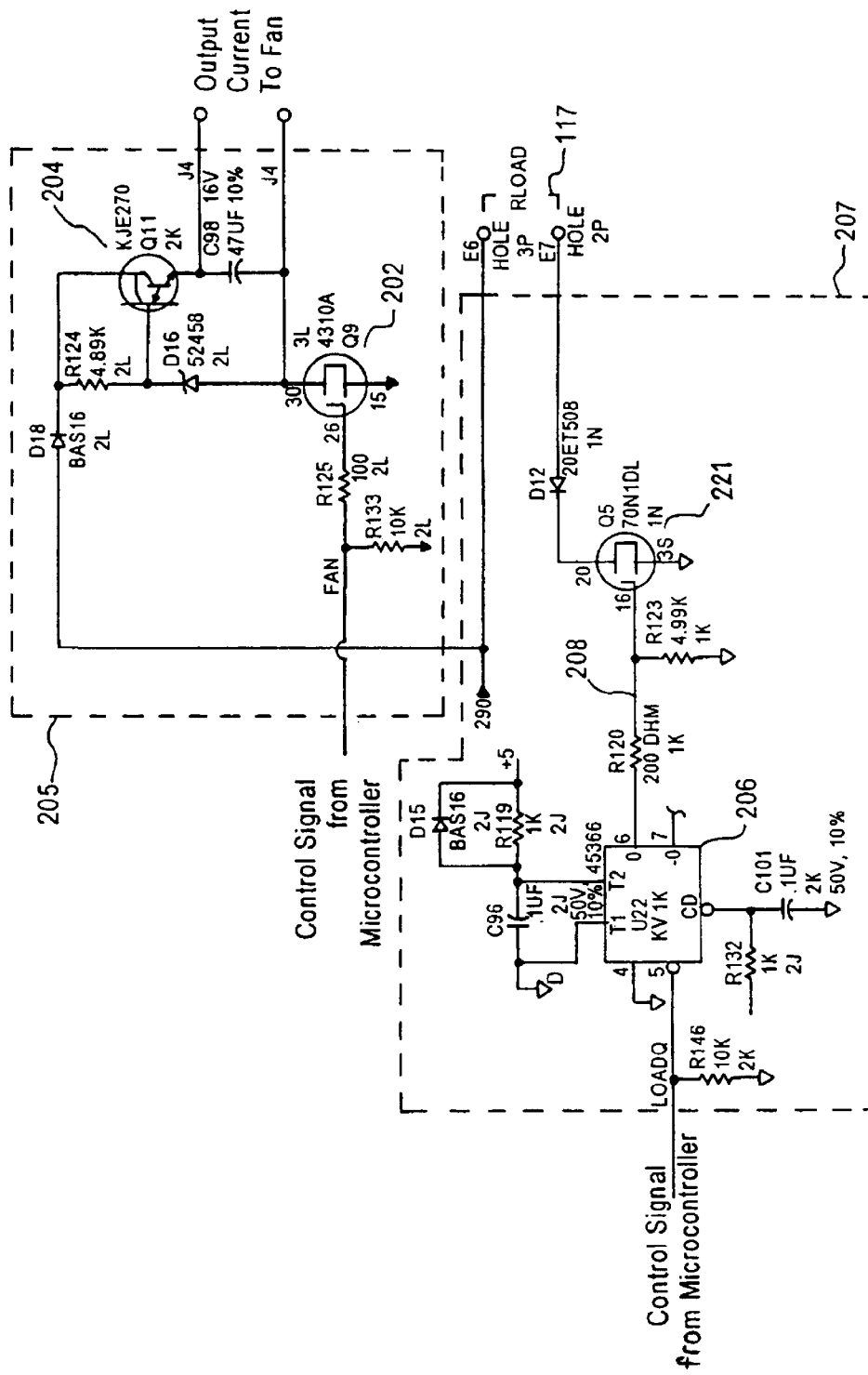
FIG. 2 shows an exemplary circuit of components used in an alternator testing system implemented according to the present invention.

FIG. 2 shows an example of a control circuit 207 for coupling load 117 to the alternator and a regulation circuit 205 for controlling operation of a fan for purpose of cooling. Control circuit 207 includes a logic IC 206 that receives a control signal from microcontroller 101 and in response generates a switch control signal 208 to control the ON/OFF of a FET switch 221, which in turn controls the coupling of load 117 to the alternator.

Regulation circuit 205 controls the operation of a fan. A transistor 204 regulates the voltage to the fan. The fan couples to the power source through a FET switch 202, which is controlled by a control signal generated by microcontroller 101. The FET switch 202, in response to the content of the control signal, turns on or off the power to the fan. When the temperature at load 117 is too high, microcontroller generates a control signal to control FET switch 202 to couple the fan to the power source and turns on the fan. If, the temperature of load 117 drops below a predetermined temperature, microcontroller 101 generates another control signal to control the FET switch 202 to turn off the power of the fan.

Figure 3:
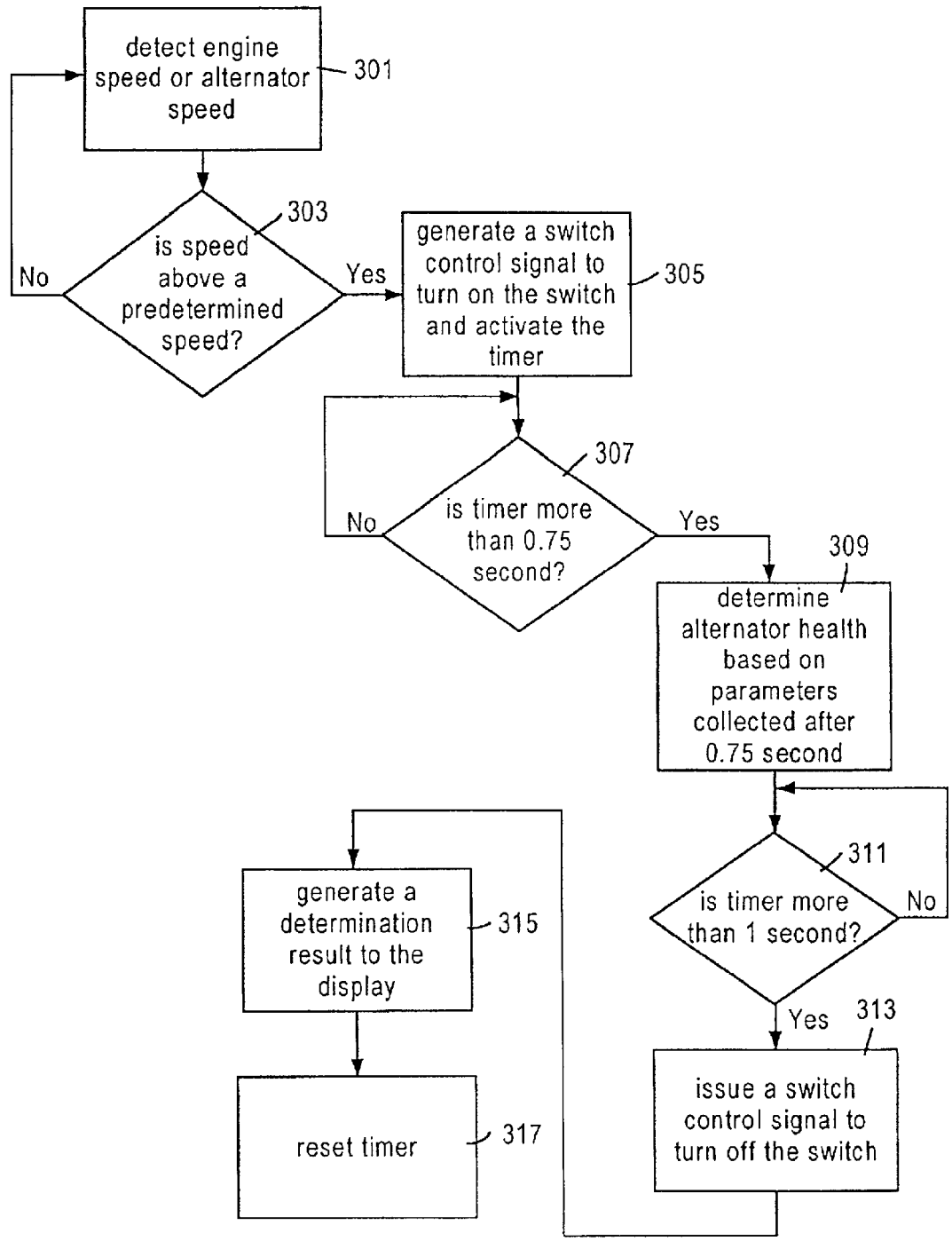
FIG. 3 shows a flow chart illustrating the testing procedure carried out by an alternator testing system implemented according to the present invention.

FIG. 3 shows a flow chart illustrating the testing procedure carried out by an alternator testing system implemented according to the present invention. At steps 301 and 303, microcontroller 101 determines whether the engine speed or alternator speed has reached a predetermined speed. If not, microcontroller continues the determination. If yes, microcontroller 101 generates a switch control signal to turn on the switch and couple the load to the alternator. Microcontroller 101 also turns on a timer (Step 305). At step 307, microcontroller 101 reads the timer and determines if the load has been coupled to the alternator for more than 0.75 second. If not, microcontroller 101 continues the determination; otherwise, microcontroller 101 starts to determine the health of the alternator based on parameters of the alternator output signal collected after 0.75 second (step 309). Then microcontroller 101 determines if the load has been coupled to the alternator for more than 1 second (step 311). If not, microcontroller 101 continues the determination; otherwise, microcontroller 101 issues a switch control signal to turn off the switch and decouple the load from the alternator (Step 313). Microcontroller 101 then generates a determination result to the display and resets the timer (steps 315 and 317).

Figure 4:
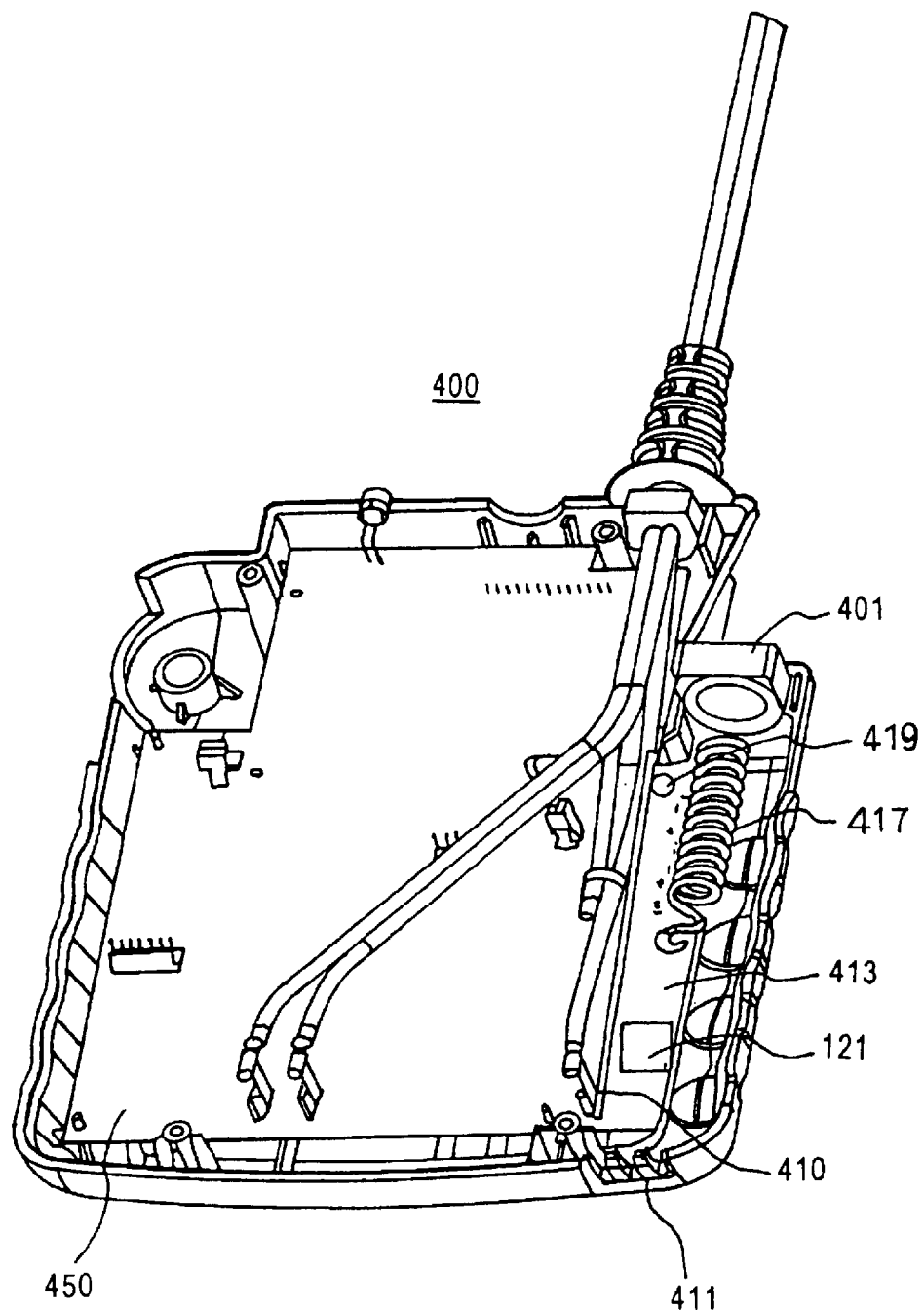
FIG. 4 shows an example of the cooling arrangement implemented according to the present invention.

FIG. 4 shows an example of the cooling arrangement implemented according to the present invention, with part of a housing 400. Housing 400 has a size suitable to be held in one's hand and receives a circuit board 450 having microcontroller 101, detection circuit 109, bandpass filter 113, amplifier 111 and other components. A temperature sensor 419 is disposed at a location near a Nichrome coil 417, as the load sensing element. Switch 121, that may be an FET-type switch, is in serial connection with coil 417. An air inlet 411 is disposed on one side of the housing and a fan 401 is disposed on the other side of the housing, so that a linear channel 413 between air inlet 411 and fan 401 forms an air flow path when fan 401 is in operation. The channel is defined by a wall 410 that isolates the airflow path from the remainders of the housing. The heat generated by coil 417 will be dissipated to the surrounding air and drawn out from the housing 400 through an outlet established by fan 401 itself, as depicted.

The embodiments described above may be used with any desired system or engine. Those systems or engines may comprise items utilizing fossil fuels, such as gasoline, natural gas, propane and the like, wind and hybrids or combinations thereof. Those systems or engines may be incorporated into other systems, such as an automobile, a truck, a boat or ship, a motorcycle, a generator, an airplane and the like. The embodiments may include or be utilized with any appropriate voltage level, such as about 12 Volts, about 42 Volts and the like.

While this invention has been described in connection with an exemplary embodiment, it is to be understood that the invention is not limited to the disclosed embodiment, but on the contrary, is intended to cover various modifications and equivalent arrangements included within the spirit and scope of the appended claims.

What is claimed is:

1. A method for evaluating the operation of an alternator driven by a motor, comprising the steps of:
    detecting a motor speed or an alternator speed;
    coupling a load to the alternator upon the motor speed or the alternator speed reaching a predetermined level; and
    detecting characteristics of an alternator output signal representative of an alternator characteristic after the load has been coupled to the alternator for a first predetermined period of time, wherein the first predetermined period of time is fixed, and is chosen such that effects of noise caused by the step of coupling the load are reduced.

2. The method of claim 1, wherein the motor is the engine of a vehicle.

3. The method of claim 1, wherein the load is a Nichrome coil.

4. A method for evaluating the operation of an alternator, comprising the steps of:
    coupling a load to the alternator; and
    detecting characteristics of an alternator output signal representative of an output of the alternator only after the load has been coupled to the alternator for a first predetermined period of time, wherein the first predetermined period of time is fixed, and is chosen such that effects of noise caused by the step of coupling the load are reduced.

5. The method of claim 4, further including a step of decoupling the load from the alternator after the load has been coupled to the alternator for a second predetermined period of time greater than the first predetermined period of time.

6. The method of claim 5, wherein the second predetermined period of time is one second.

7. A system for evaluating the operation of an alternator driven by a motor, comprising:

a load;

a terminal for receiving an alternator output signal representative of an alternator characteristic;

a sensor for generating a speed signal representative of a motor speed or an alternator speed;

a switch device for selectively coupling the load to the alternator; and a controller, coupled to the sensor, the terminal and the switch device, for determining characteristics of the alternator output signal and for controlling operation of the switch device;

wherein, in response to the speed signal indicating the motor speed or the alternator speed reaching a predetermined level, the controller automatically generates a first switch operation signal to control the switch device to couple the load to the alternator, and the controller determines characteristics of the alternator output signal based on parameters collected after the load has been coupled to the alternator for a first predetermined period of time, wherein the first predetermined period of time is fixed, and is chosen such that effects of noise caused by the step of coupling the load are reduced.

8. The system of claim 7, wherein the load is a Nichrome coil.

9. The system of claim 7, further comprising a cooling device for dissipating the heat generated by the load.

10. The system of claim 9, wherein the cooling device is a fan.

11. The system of claim 7, wherein the system is contained within a housing of the size suitable to be hand held.

12. The system of claim 7, wherein the load is constructed to draw at least 50 amperes of current from the alternator.

13. The system of claim 7, wherein the controller generates a second switch operation signal to control the switch device to decouple the load from the alternator after the load has been coupled to the alternator for a second predetermined period of time.

14. The system of claim 13, wherein the second predetermined period of time is one second.

15. A system for evaluating the operation of an alternator, comprising:

a load;

a terminal for receiving an alternator output signal representative of an alternator characteristic;

a switch device for selectively coupling the load to the alternator; and a controller, coupled to the switch device and the terminal, for determining characteristics of the alternator output signal and for generating a first switch operation signal to control the switch device to couple the load to the alternator; and wherein the controller determines the characteristics of the alternator output signal based on parameters collected only after the load has been coupled to the alternator for a first predetermined period of time; and wherein the first predetermined period of time is fixed, and is chosen such that effects of noise caused by the step of coupling the load are reduced.

16. The system of claim 15, wherein the controller generates a second switch operation signal to control the switch device to decouple the load from the alternator after the load has been coupled to the alternator for a second predetermined period of time.

17. The system of claim 16, wherein the second predetermined period of time is one second.

18. The system of claim 15, wherein the alternator is used in an automotive vehicle to charge a battery.

19. A system of claim 15, wherein the terminal receives the alternator output signal through a wireless link.

20. A system of claim 19, wherein the wireless link is an infrared wireless link.

21. A system of claim 19, wherein the wireless link is a radio wave wireless link.

22. The system of claim 15, further comprising a housing including:

a first compartment for receiving a circuit board including the controller mounted thereon;

a second compartment for housing the load;

an air inlet disposed on one side of the second compartment;

a fan forming an air outlet on the other side of the second compartment; and wherein the load, the air inlet and the fan are substantially in line, the air inlet and the fan form an air flow path, when the fan is in operation, the heat generated by the load is dissipated to the surrounding air and drawn out through the air outlet, and the housing has a size suitable to be held in one's hand.

23. A method for evaluating the operation of an alternator, comprising the steps of:

coupling a load to the alternator; and evaluating the operation of the alternator based on parameters collected after the load being coupled to the alternator for a first predetermined period of time, wherein the first predetermined period of time is fixed, and is chosen such that effects of noise caused by the step of coupling the load are reduced.

24. A method for evaluating the operation of an alternator driven by a motor, comprising the machine-implemented steps of:

detecting a motor speed or an alternator speed;

coupling a load to the alternator upon the motor speed or the alternator speed reaching a predetermined level; and detecting characteristics of an alternator output signal representative of an alternator characteristic after the load has been coupled to the alternator for a first predetermined period of time, wherein the first predetermined period of time is fixed, and is chosen such that effects of noise caused by the step of coupling the load are reduced.

25. A system for evaluating the operation of an alternator driven by a motor, comprising:

a load;

terminal means for receiving an alternator output signal representative of an alternator characteristic;

sensor means for generating a speed signal representative of a motor speed or an alternator speed;

switch means for selectively coupling the load to the alternator;

control means, coupled to the sensor means, the terminal means and the switch means, for determining characteristics of the alternator output signal and for controlling operation of the switch means;

wherein, in response to the speed signal indicating the motor speed or the alternator speed reaching a predetermined level, the control means automatically generates a first switch operation signal to control the switch means to couple the load to the alternator, and the control means determines characteristics of the alternator output signal based on parameters collected after the load has been coupled to the alternator for a first predetermined period of time, wherein the first predetermined period of time is fixed, and is chosen such that effects of noise caused by the step of coupling the load are reduced.

26. The system of claim 25, wherein the controller generates a second switch operation signal to control the switch means to decouple the load from the alternator after the load has been coupled to the alternator for a second predetermined period of time.

27. The system of claim 26, wherein the second predetermined period of time is one second.

* * * * *